United States Patent
Koo et al.

(10) Patent No.: US 9,922,795 B2
(45) Date of Patent: Mar. 20, 2018

(54) HIGH BRIGHTNESS ION BEAM EXTRACTION USING BIAS ELECTRODES AND MAGNETS PROXIMATE THE EXTRACTION APERTURE

(71) Applicant: Varian Semiconductor Equipment Associates, Inc., Gloucester, MA (US)

(72) Inventors: Bon-Woong Koo, Andover, MA (US); Alexandre Likhanskii, Malden, MA (US); Svetlana B. Radovanov, Brookline, MA (US); Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 121 days.

(21) Appl. No.: 14/809,608

(22) Filed: Jul. 27, 2015

(65) Prior Publication Data

US 2017/0032927 A1 Feb. 2, 2017

(51) Int. Cl.
*H01J 37/14* (2006.01)
*H01J 37/08* (2006.01)
*H01J 27/02* (2006.01)
*H01J 37/145* (2006.01)
*H01J 37/32* (2006.01)

(52) U.S. Cl.
CPC .......... *H01J 37/14* (2013.01); *H01J 27/024* (2013.01); *H01J 37/08* (2013.01); *H01J 37/145* (2013.01); *H01J 27/022* (2013.01); *H01J 37/3211* (2013.01)

(58) Field of Classification Search
None
See application file for complete search history.

(56) References Cited

U.S. PATENT DOCUMENTS

| 5,266,146 A * | 11/1993 | Ohno | H01J 37/32357 |
| | | | 118/723 MA |
| 5,365,070 A * | 11/1994 | Anderson | H01J 27/028 |
| | | | 250/423 R |
| 6,332,947 B1 * | 12/2001 | Ichimura | H01J 37/32082 |
| | | | 118/723 MA |

(Continued)

OTHER PUBLICATIONS

Alexandre Likhanskii, Ion Beam Uniformity Control, U.S. Appl. No. 14/516,032, filed Oct. 16, 2014.

*Primary Examiner* — Wyatt Stoffa
*Assistant Examiner* — James Choi
(74) *Attorney, Agent, or Firm* — Nields, Lemack & Frame, LLC

(57) ABSTRACT

An apparatus for the creation of high current ion beams is disclosed. The apparatus includes an ion source, such as a RF ion source or an indirectly heated cathode (IHC) ion source, having an extraction aperture. Disposed proximate the extraction aperture is a bias electrode, which has a hollow center portion that is aligned with the extraction aperture. A magnetic field is created along the perimeter of the hollow center portion, which serves to contain electrons within a confinement region. Electrons in the confinement region energetically collide with neutral particles, increasing the number of ions that are created near the extraction aperture. The magnetic field may be created using two magnets that are embedded in the bias electrode. Alternatively, a single magnet or magnetic coils may be used to create this magnetic field.

18 Claims, 4 Drawing Sheets

(56) References Cited

U.S. PATENT DOCUMENTS

| | | | | |
|---|---|---|---|---|
| 6,559,454 B1* | 5/2003 | Murrell | ............... | H01J 27/022 250/423 R |
| 2011/0068691 A1* | 3/2011 | Scherer | ............... | H01J 27/16 315/111.31 |
| 2014/0184073 A1* | 7/2014 | Crowley | ............ | H01J 37/3405 315/111.41 |
| 2015/0108894 A1* | 4/2015 | Biloiu | ............... | H01J 37/3211 315/34 |
| 2015/0354056 A1* | 12/2015 | Koo | ............. | C23C 14/48 427/523 |

* cited by examiner

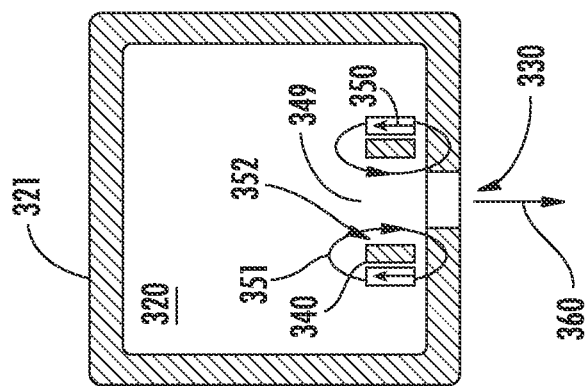
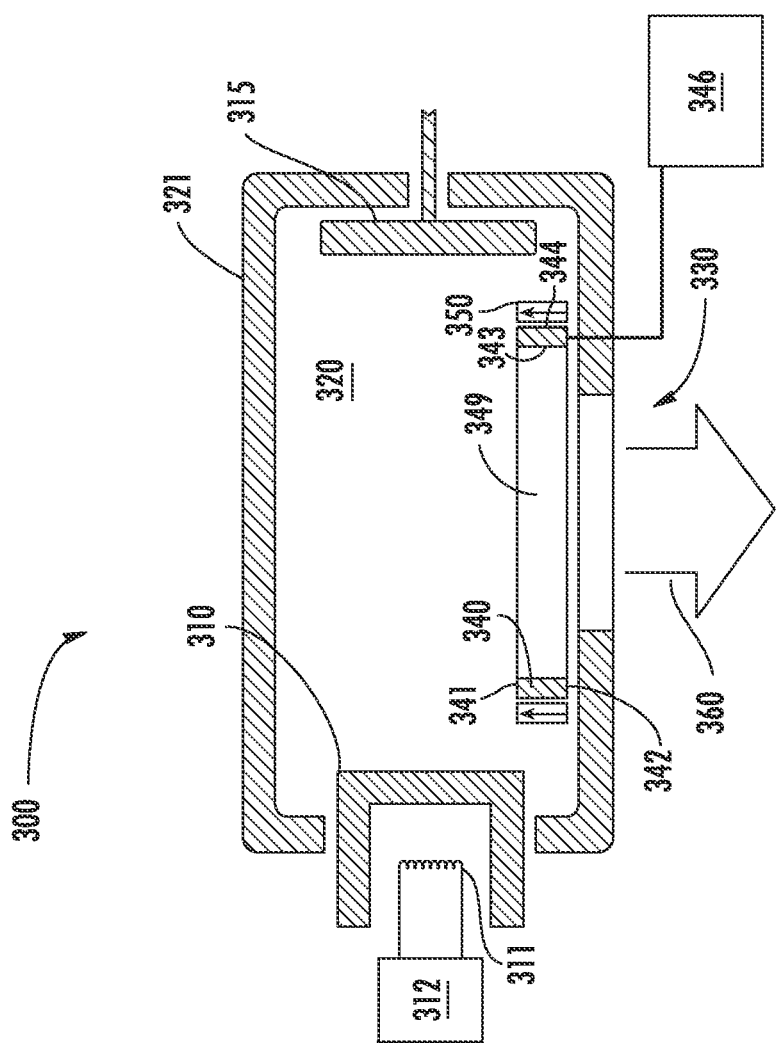

HIGH BRIGHTNESS ION BEAM EXTRACTION USING BIAS ELECTRODES AND MAGNETS PROXIMATE THE EXTRACTION APERTURE

FIELD

Embodiments relate to an apparatus for improving ion beam quality in an ion implantation system, and more particularly, an ion source having a magnetized local high-density plasma.

BACKGROUND

Semiconductor workpieces are often implanted with dopant species to create a desired conductivity. For example, solar cells may be implanted with a dopant species to create an emitter region. This implant may be done using a variety of different mechanisms.

In certain embodiments, an ion source is used. In certain embodiments, the ion source may comprise an RF ion source. This RF ion source may include an RF antenna, to which RF power is applied. The RF antenna may be disposed near a wall of the ion source chamber, which may be made of a dielectric material. One or more gas containers may be in communication with the ion source chamber so as to supply feed gas to the ion source chamber. The excitation of the RF antenna results in the creation of electromagnetic energy, which may excite feed gas disposed within the ion source chamber to create a plasma. Ions from this plasma may be extracted from the RF ion source using, for example, extraction electrodes, and directed toward a workpiece. These extracted ions may become implanted in the workpiece.

In other embodiments, the ion source may include an indirectly heated cathode, which emits energetic electrons. These electrodes collide energetically with the feed gas in the ion source chamber, forming ions, which may be extracted through an extraction aperture. Of course, other ion sources may also be used.

In certain embodiments, it may be beneficial to create a high current ion beam. In certain embodiments, this may be done by creating a denser plasma in the ion source. In the case of an RF ion source, this may be achieved by increasing the RF power supplied to the RF antenna and/or supplying more feed gas to the ion source chamber. However, increased consumption of feed gas may increase the overall cost. Additionally, higher RF power may result in elevated contamination levels and lower dopant fractionation. High RF power may also result in a shortened life for the RF ion source and therefore, lower tool utilization.

Therefore, an apparatus that increases ion beam current for an ion source without these drawbacks would be beneficial. It would be advantageous if the apparatus created a high density plasma near the extraction aperture to maximize the extracted ion beam current.

SUMMARY

An apparatus for the creation of high current ion beams is disclosed. The apparatus includes an ion source, such as a RF ion source or an indirectly heated cathode (IHC) ion source, having an extraction aperture. Disposed proximate the extraction aperture is a bias electrode, which has a hollow center portion that is aligned with the extraction aperture. A magnetic field is created along the perimeter of the hollow center portion. The magnetic field serves to contain electrons within a confinement region. Electrons in the confinement region energetically collide with neutral particles, increasing the number of ions that are created near the extraction aperture. The magnetic field may be created using two magnets that are embedded in the bias electrode. Alternatively, a single magnet or magnet coils may be used to create this magnetic field.

According to one embodiment, an apparatus for creating a high current ion beam is disclosed. The apparatus comprises an ion source having an ion source chamber and an extraction aperture; a bias electrode disposed proximate the extraction aperture, having an inner surface defining a perimeter of a hollow center portion that is aligned with the extraction aperture; and a magnetic field disposed along the perimeter of the hollow center portion, creating a confinement region for electrons proximate the inner surface. In certain embodiments, the bias electrode and the magnetic field are disposed within the ion source chamber. In certain embodiments, the bias electrode and the magnetic field are disposed outside of the ion source chamber. In certain embodiments, a coating is disposed on the inner surface of the bias electrode. In certain further embodiments, the coating is made of a material comprising a dopant species.

According to another embodiment, an apparatus for creating a high current ion beam is disclosed. The apparatus comprises an ion source having an ion source chamber and an extraction aperture; a bias electrode disposed within the ion source chamber and proximate the extraction aperture, the bias electrode having an inner surface defining a perimeter of a hollow center portion that is aligned with the extraction aperture; a first magnet embedded in the bias electrode and oriented with a north pole disposed toward the hollow center portion; and a second magnet, parallel to the first magnet, embedded in the bias electrode and oriented with a south pole disposed toward the hollow center portion, wherein a U-shaped magnetic field is created between the north pole of the first magnet and the south pole of the second magnet, and wherein a confinement region to contain electrons is created along the inner surface of the bias electrode by the U-shaped magnetic field. In certain embodiments, the north pole of the first magnet and the south pole of the second magnet are coplanar with the inner surface. In certain embodiments, channels are disposed within the bias electrode and the apparatus further comprises a source of coolant, and a conduit in communication with the source of coolant and the channels within the bias electrode.

According to another embodiment, an apparatus for creating a high current ion beam is disclosed. The apparatus comprises an ion source having an ion source chamber and an extraction aperture; a bias electrode disposed within the ion source chamber and proximate the extraction aperture, the bias electrode having an inner surface defining a perimeter of a hollow center portion that is aligned with the extraction aperture, and an outer surface opposite the inner surface; and a magnet disposed proximate the outer surface of the bias electrode and oriented with a first pole of the magnet disposed toward the ion source chamber and a second pole of the magnet disposed toward a chamber wall containing the extraction aperture; wherein a magnetic field is created between the first pole of the magnet and the second pole of the magnet that encircles the bias electrode, and wherein a confinement region to contain electrons is created along the inner surface of the bias electrode by the magnetic field. In certain embodiments, the magnet is parallel to the inner surface of the bias electrode.

BRIEF DESCRIPTION OF THE FIGURES

For a better understanding of the present disclosure, reference is made to the accompanying drawings, which are incorporated herein by reference and in which:

FIGS. 3A-3B show a front view and a side view, respectively, of an ion source according to another embodiment.

DETAILED DESCRIPTION

As described above, in certain embodiments, high current ion beams are beneficial. To create a high current ion beam, it may be beneficial to create a larger number of ions within the ion source chamber. The present disclosure describes an apparatus for creating a larger number of ions through the use of a localized magnetic field near the extraction aperture of the ion source chamber. This apparatus may be employed with any type of ion source, include an RF ion source, an indirectly heated cathode (IHC) ion source or any other type.

Figure 1A:
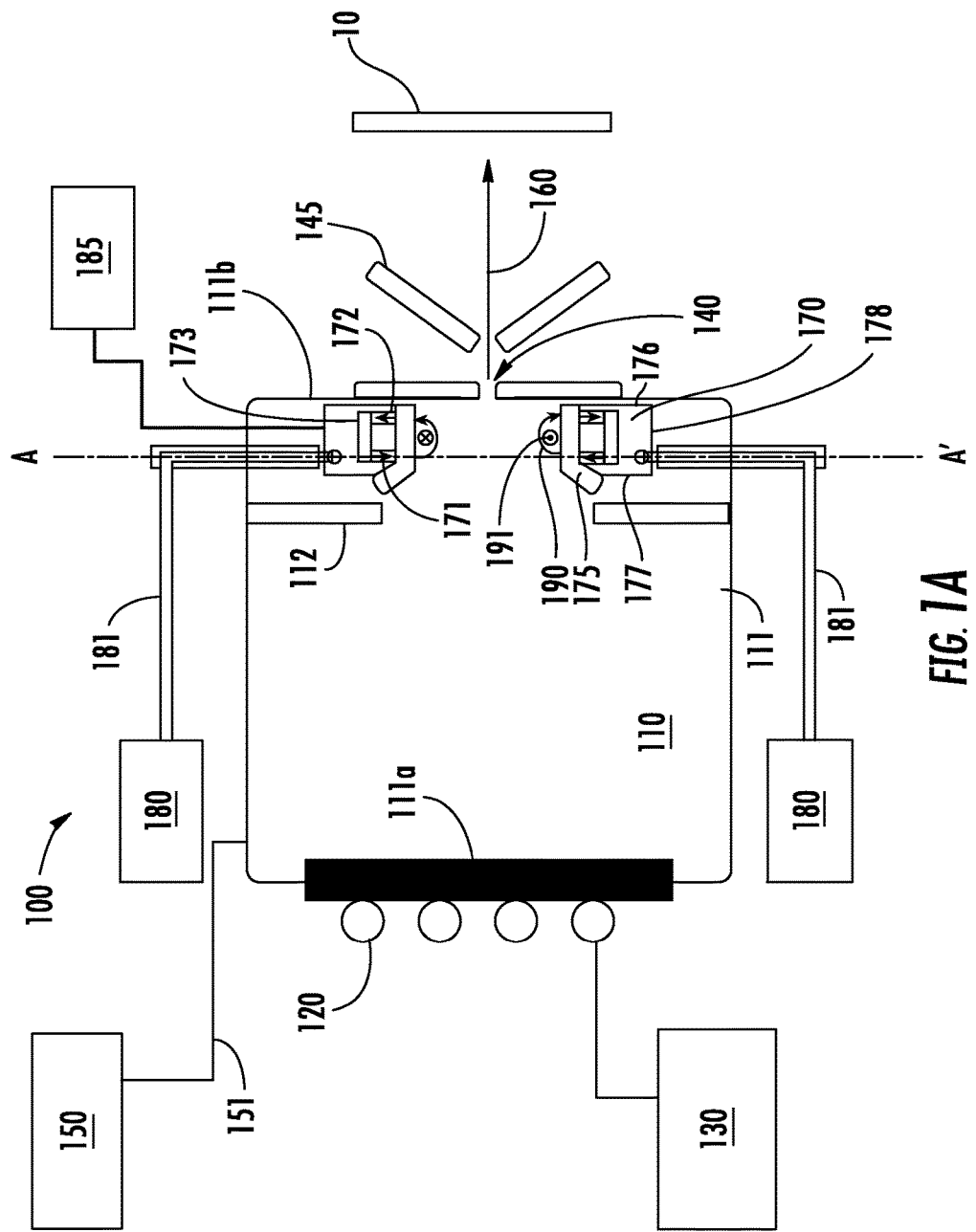
FIG. 1A shows an ion source according to one embodiment.

FIG. 1A shows a first embodiment of an ion source having increased ion generation near the extraction aperture. In this embodiment, an RF ion source 100 is illustrated. The RF ion source 100 comprises a plurality of chamber walls 111 defining an ion source chamber 110. A first chamber wall 111a, or a portion thereof, may be constructed of a dielectric material, such as quartz or alumina. An RF antenna 120 may be disposed proximate the first chamber wall 111a, on the outside of the ion source chamber 110. The RF antenna 120 may comprise an electrically conductive material, such as copper, which may be wound in a spiral fashion. An RF power supply 130 is in electrical communication with the RF antenna 120. The RF power supply 130 may supply RF power to the RF antenna 120. The power supplied by the RF power supply 130 may be in the range of 1 to 10 kW and may have any suitable frequency, such as 2, 13.56 or 27 MHz.

In certain embodiments, the chamber walls 111, with the exception of the dielectric window, are electrically conductive, and may be constructed of a metal or another conductive material. In certain embodiments, these chamber walls 111 may be electrically biased. A second chamber wall 111b, which may be opposite the first chamber wall 111a, includes an extraction aperture 140. The extraction aperture 140 may be an opening through which the ions generated in the ion source chamber 110 are extracted and directed toward a workpiece 10. The extraction aperture 140 may be any suitable shape. In certain embodiments, the extraction aperture 140 may be oval or rectangular shaped, having one dimension, referred to as the length, which may be much larger than the second dimension, referred to as the height. Disposed outside the extraction aperture 140 may be one or more extraction electrodes 145. The extraction electrodes 145 may be made of a conductive material and at least one of the extraction electrodes 145 may be negatively biased to attract positive ions from within the ion source chamber 110 toward the workpiece 10.

A gas container 150 may be in communication with the ion source chamber 110, such as via a gas inlet 151. The gas container 150 may hold one or more feed gasses, which are used to create a plasma within the ion source chamber 110. The feed gasses may comprise any suitable dopant, including but not limited to boron, phosphorus, and arsenic. In certain embodiments, the feed gasses may be other species, such as atoms or molecules containing Group 3, Group 4 or Group 5 elements. In certain embodiments, the feed gasses may also include inert gasses such as nitrogen, hydrogen, argon, neon, krypton, or xenon. Additionally, the feed gasses may also include mixtures of various gasses. The flow of gas into the ion source chamber 110 may be controlled by a mass flow controller disposed proximate the gas inlet 151. The pressure within the ion source chamber 110 may be in the range of less than 10 mTorr.

In operation, feed gas from the gas container 150 is flowed to the ion source chamber 110 through the gas inlet 151. RF power is applied to the RF antenna 120 by the RF power supply 130. The electromagnetic energy created by the RF antenna 120 causes the feed gas to create a plasma within the ion source chamber 110. The negatively biased extraction electrodes 145 disposed outside the extraction aperture 140 attract the positive ions from the plasma and accelerate those positive ions toward the workpiece 10, where the positive ions are implanted. In certain embodiments, the extracted ions may be mass analyzed or otherwise manipulated prior to impacting the workpiece 10.

Figure 1B:
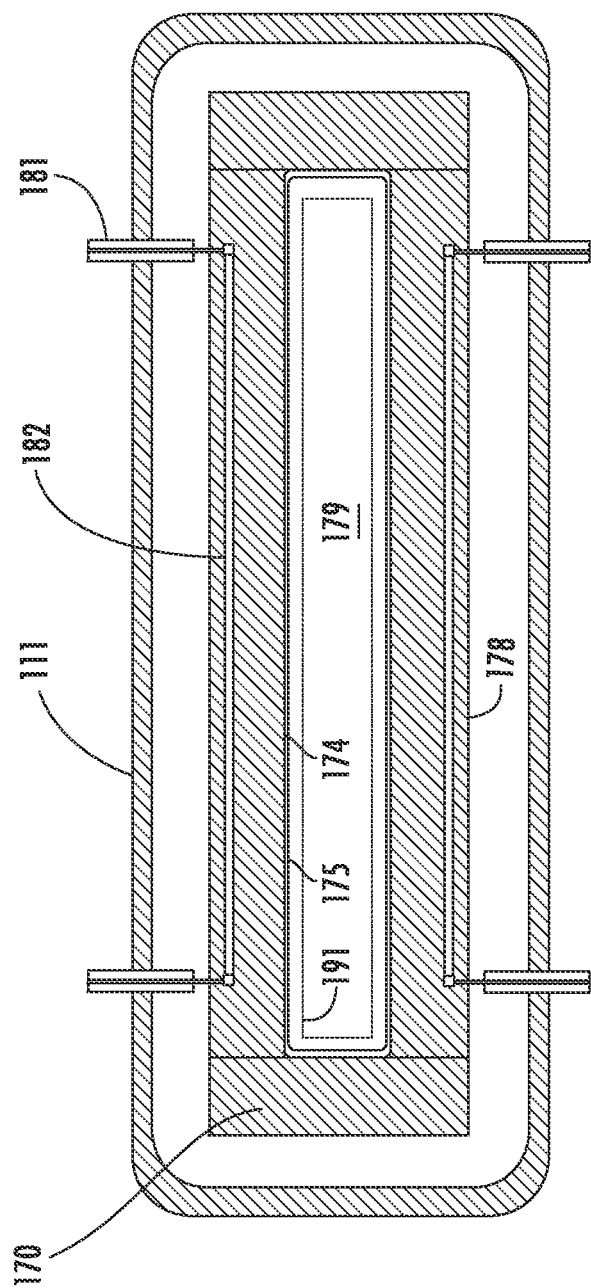
FIG. 1B shows a cross-section of the ion source of FIG. 1A taken along line AA'.

FIG. 1A shows a first embodiment of an apparatus that increases the current of the ion beam 160 that is extracted through the extraction aperture 140. FIG. 1B shows a cross-section of this apparatus taken along line A-A'.

Disposed within the ion source chamber 110 and proximate the extraction aperture 140 near the second chamber wall 111b is a bias electrode 170. In some embodiments, the distance between the bias electrode 170 and the second chamber wall 111b may be between 2 and 10 mm, although other separation distances may be used. This bias electrode 170 may have a hollow center portion 179 (see FIG. 1B) that is at least as large as and is aligned with the extraction aperture 140. In some embodiments, such as that shown in FIG. 1B, the hollow center portion 179 may be rectangular in shape, dimensioned so as to be larger than the extraction aperture 140. The bias electrode 170 may have a first surface 177, which is the surface closest to the interior of the ion source chamber 110, and a second surface 176, which is the surface closest to the second chamber wall 111b. The bias electrode 170 may also have an outer surface 178, which connects the first surface 177 and the second surface 176 along the outer perimeter of the bias electrode 170. The bias electrode 170 may also have an inner surface 174 (see FIG. 1B), which connects the first surface 177 and the second surface 176 along the hollow center portion 179. Thus, the inner surface 174 defines the perimeter of the hollow center portion 179.

The bias electrode 170 may be constructed of a metal, such as aluminum, or any electrically conductive material, such as graphite, silicon or silicon carbide. Disposed within the bias electrode 170 may be a first magnet 171. This first magnet 171 may have its north pole oriented toward the hollow center portion 179 of the bias electrode 170. The first magnet 171 may be embedded in the bias electrode 170, near the inner surface 174. In certain embodiments, the north pole of the first magnet 171 is coplanar with the inner surface 174. The first magnet 171 may actually comprise a plurality of magnets, linearly arranged around the perimeter of the inner surface 174, where all of these magnets have their north poles oriented toward the hollow center portion 179 of the bias electrode 170. In certain embodiments, the first magnet 171 may be arranged around the entirety of the perimeter of the inner surface 174. In other embodiments, the first magnet 171 may only be disposed along a portion of the perimeter of the inner surface 174, such as along the longer sides.

A second magnet 172 may also be embedded in the bias electrode 170. The second magnet 172 may be parallel to the first magnet 171 and have its south pole oriented toward the hollow center portion 179 of the bias electrode 170. In certain embodiments, the south pole of the second magnet 172 is coplanar with the inner surface 174. Like the first magnet 171, the second magnet 172 may actually comprise a plurality of magnets, linearly arranged around the perimeter of the inner surface 174, where all of these magnets have their south poles oriented toward the hollow center portion 179 of the bias electrode 170. In certain embodiments, the second magnet 172 may be arranged around the entirety of the perimeter of the inner surface 174. In other embodiments, the second magnet 172 may only be disposed along a portion of the perimeter of the inner surface 174, such as along the longer sides.

The first magnet 171 and the second magnet 172 are arranged such that one is closer to the ion source chamber 110 and the other is closer to the second chamber wall 111b. The first magnet 171 and the second magnet 172 may be disposed about 2 to 3 cm apart, although other distances may also be used. The first magnet 171 and the second magnet 172 may be made of Sm—Co, or another suitable magnetic material. In certain embodiments, magnetic coils may be employed. The embedded south pole of the first magnet 171 and the embedded north pole of the second magnet 172 may be physically connected using a ferrous material, such as steel member 173, which is also embedded in the bias electrode 170. In certain embodiments, the magnetic field 190 is confined within the hollow center portion 179 so that the magnetic field 190 does not diffuse into the ion source chamber 110 or through the extraction aperture 140.

The positioning of the first magnet 171 and the second magnet 172 causes the formation of a magnetic field 190 that curves between the north pole of the first magnet 171 and the south pole of the second magnet 172. This magnetic field 190 may be semi-circular or U-shaped. The magnetic field 190 and the inner surface 174 define a confinement region 191, which may be in the shape of a racetrack around the perimeter of the hollow center portion 179. Thus, the confinement region 191 is along the entirety of the inner surface 174 of the hollow center portion 179, as shown in FIG. 1B. Electrons may be contained within this confinement region 191.

The electrons contained in the confinement region 191 collide with the neutral particles that diffuse near the extraction aperture 140. These collisions cause the formation of a high density localized plasma near the confinement region 191. This increases the extracted ion beam current.

The bias electrode 170 may be electrically biased using an electrode power supply 185. In certain embodiments, the bias electrode 170 may be biased at a negative voltage, such as between −100V and −500V. In certain embodiments, the bias voltage may be a constant DC voltage or may be a pulsed DC voltage. In certain embodiments, the bias electrode 170 may be biased using a RF waveform. In other embodiments, the bias electrode 170 may be segmented such that different portions of the bias electrode 170 may be biased at different voltages. This technique may be used to enhance beam uniformity in some embodiments.

The ion bombardment from the locally created plasma ions may heat the bias electrode 170. Therefore, in certain embodiments, a coolant may be flowed through a channel 182 in the bias electrode 170. A coolant source 180 may provide a coolant that flows through conduit 181 to a channel 182 in the bias electrode 170. This coolant may be water or another liquid.

A coating 175 may be disposed on the inner surface 174 of the bias electrode 170. This coating 175 may be made of graphite or silicon carbide, and may be used to protect the underlying bias electrode 170. However, in other embodiments, this coating 175 may be comprised of a dopant material. For example, in the case where boron ions are to be extracted from the RF ion source 100, the coating 175 may be pure boron, boron carbide or another boron-based ceramic material. In the case where phosphorus ions are to be extracted from the RF ion source 100, the coating 175 may be silicon phosphide or another phosphorus-based ceramic material. In operation, energetic particles may strike the coating 175, causing sputtering. The sputtered material may be neutral particles. However, these neutral particles may collide with the electrons in the confinement region 191 and become ionized, providing additional dopant-containing ions. Thus, by using a coating 175 made of the desired dopant, additional ions of the desired species may be created by the sputtering action.

Further, a shield 112 may be disposed in the ion source chamber 110 to stop the diffusion of plasma toward the outer surface 178 of the bias electrode 170. The shield 112 may extend from the chamber walls 111 toward the interior of the ion source chamber 110. The shield 112 may be dimensioned to extend to a position that is aligned with the hollow center portion 179.

Thus, in this embodiment, the apparatus includes a bias electrode 170, which is configured so that the hollow center portion 179 may be dimensioned to be larger than the extraction aperture 140 and is aligned with the extraction aperture 140. The hollow center portion 179 is defined by an inner surface 174. A first magnet 171, having its north pole oriented toward the hollow center portion 179, is embedded in the bias electrode 170. A second magnet 172, having its south pole oriented toward the hollow center portion 179, is also embedded in the bias electrode 170, parallel to the first magnet 171. One of these magnets may be disposed closer to the ion source chamber 110 than the other magnet. A ferrous material, such as steel member 173, may be used to connect the embedded south pole of the first magnet 171 and the embedded north pole of the second magnet 172. The north pole of the first magnet 171 and the south pole of the second magnet 172 may be coplanar with the inner surface. The bias electrode 170 may also be negatively biased, using either a constant or pulsed voltage, or may be biased using an RF waveform. This configuration creates a U-shaped magnetic field 190 along the inner surface 174, or perimeter of the hollow center portion 179, which in turn creates a confinement region 191 that contains the electrons. These electrons collide with neutral particles to increase the number of ions created near the extraction aperture 140.

FIGS. 1A-1B show the use of a first magnet 171 and a second magnet 172 embedded in the bias electrode 170 to create the U-shaped magnetic field 190. In this embodiment, the first magnet 171 and the second magnet 172 are arranged perpendicular to the inner surface 174 such that only one pole of each magnet is facing the hollow center portion 179. However, the U-shaped magnetic field 190 may be created in other ways. For example, rather than using two different magnets, each arranged with a pole oriented toward the hollow center portion 179, one magnet may be used. In this configuration, the magnet may be oriented to be parallel to the inner surface 174, such that both of its poles are equidistant from the inner surface 174. This configuration is shown in more detail in FIGS. 3A-3B.

Figure 2:
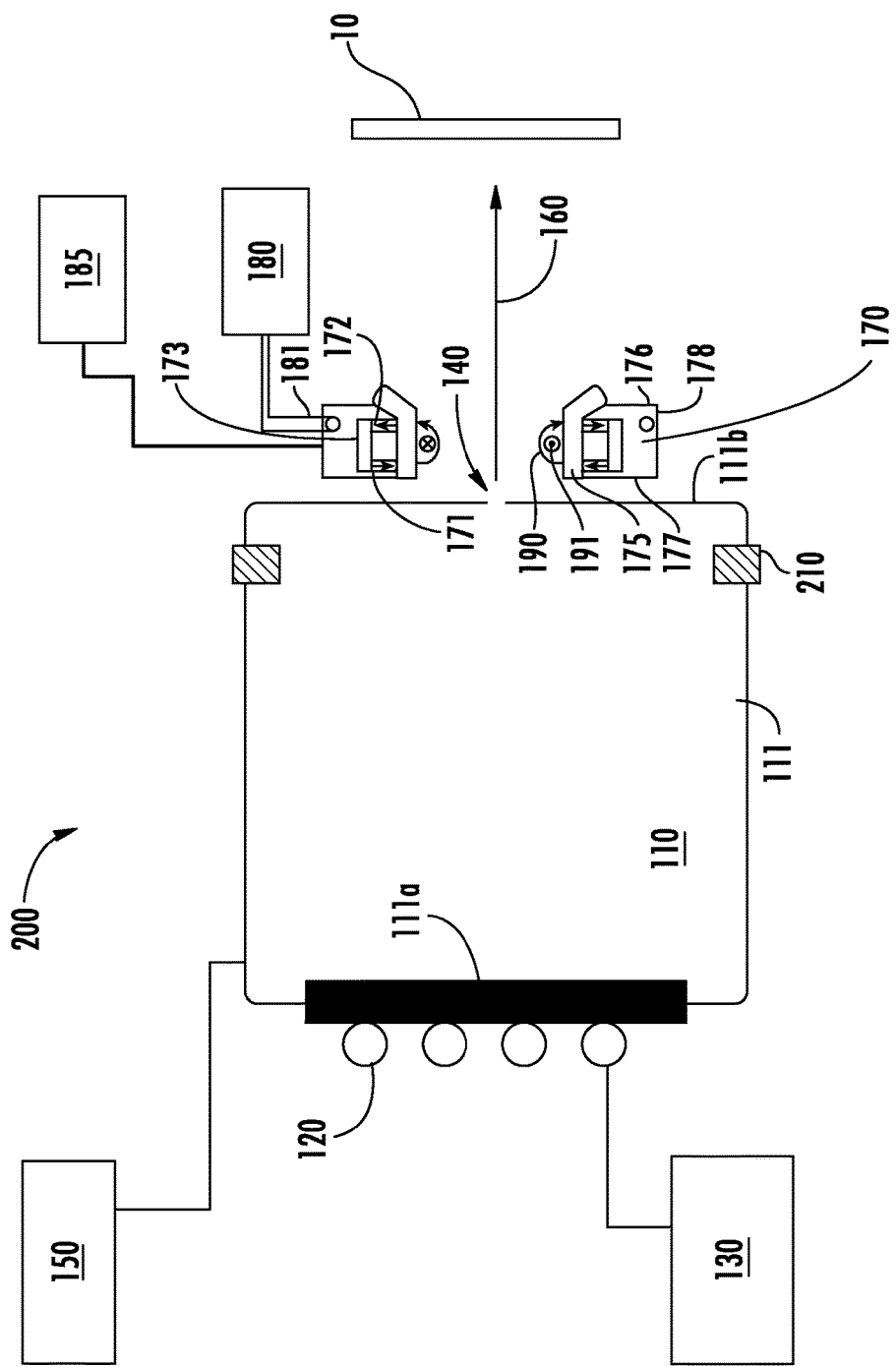
FIG. 2 shows an ion source according to another embodiment.

While FIGS. 1A-1B show the apparatus installed inside the ion source chamber 110 of the RF ion source 100, other embodiments are also within the scope of the disclosure. For example, FIG. 2 shows an RF ion source 200, where the apparatus is disposed proximate the extraction aperture 140, but is outside the ion source chamber 110. In this embodiments, like components have been given identical reference designators. The bias electrode 170 is disposed outside the ion source chamber 110 and proximate the extraction aperture 140. The hollow center portion 179 is aligned with the extraction aperture 140 such that ions exiting the extraction aperture 140 pass through the hollow center portion 179 of the bias electrode 170. The configuration of the first magnet 171, the second magnet 172, the steel member 173 and the coating 175 are as described in FIG. 1A, and similarly result in the creation of a U-shaped magnetic field 190, which creates a confinement region 191. As was described with respect to FIGS. 1A-1B, this confinement region 191 is defined by the U-shaped magnetic field 190 and the inner surface 174, which is the perimeter of the hollow center portion 179. Thus, the confinement region 191 is along the entirety of the inner surface 174 of the hollow center portion 179.

In certain embodiments, an extraction electrode (not shown) may be used to attract positive ions from the ion source chamber 110 through the extraction aperture 140. In another embodiment, shown in FIG. 2, the second chamber wall 111b may be electrically isolated from the other chamber walls 111, such as through the use of insulating material 210. In this way, second chamber wall 111b may be maintained at a different voltage than the rest of the chamber walls 111.

While FIGS. 1A-1B and FIG. 2 described the ion source as being an RF ion source, other configurations are also possible. For example, FIGS. 3A-3B show an ion source 300 that utilizes an indirectly heated cathode 310 to emit electrons into the ion source chamber 320. FIG. 3A represents a front view of the ion source 300, while FIG. 3B represents a side view of the ion source 300. The ion source chamber 320 comprises a plurality of chamber walls 321. An indirectly heated cathode 310 may be disposed on one of these chamber walls 321. Disposed behind the indirectly heated cathode 310 may be a filament 311, which is in electrical communication with a filament power supply 312. The power supplied to the filament 311 causes the release of electrons, which strike the indirectly heated cathode 310, which, in turn, releases electrons into the ion source chamber 320. On the chamber wall opposite the indirectly heated cathode 310, a repeller 315 may be disposed. The repeller 315 is negatively biased and serves to repel electrons back toward the indirectly heated cathode 310, so as to maximize the likelihood that the electrons will collide with a feedgas that is introduced into the ion source chamber 320.

An extraction aperture 330 is located in one of the chamber walls 321, such as the bottom wall. Like all ion sources, the positive ions created in the ion source chamber 320 are extracted through the extraction aperture 330 to form an ion beam. In certain embodiments, the extraction aperture 330 may have a first dimension (shown in FIG. 3A) that is much longer than the second dimension (shown in FIG. 3B). This allows for the extraction of a ribbon ion beam 360. One or more extraction electrodes (not shown) may be disposed outside of the extraction aperture 330. At least one of these extraction electrodes may be negatively biased to attract positive ions from the ion source chamber 320 through the extraction aperture 330.

An apparatus to increase the number of ions in the extracted ion beam is also shown. The apparatus includes a bias electrode 340. As in the previous embodiments, the bias electrode 340 has a hollow center portion 349 that is at least as large as the extraction aperture 330 and aligned with the extraction aperture 330, such that ions flow through the hollow center portion 349 and then through the extraction aperture 330. The bias electrode 340 has a first surface 341 facing the ion source chamber 320 and a second surface 342 closer to the chamber wall 321 containing the extraction aperture 330. The bias electrode 340 also has an inner surface 343 that connects the first surface 341 and the second surface 342, and defines the perimeter of the hollow center portion 349. The bias electrode 340 also has an outer surface 344 that also connects the first surface 341 and the second surface 342, opposite the inner surface 343. The bias electrode 340 may be shaped similar to that shown in FIG. 1B. As described above, the bias electrode 340 may be made of metal, such as aluminum or an electrically conductive material such as graphite, silicon or silicon carbide. Further, the bias electrode 340 may be in communication with an electrode power supply 346. The bias electrode 340 may be negatively biased. In certain embodiments, the bias electrode 340 may be biased at −100V to −500V, either as a fixed or pulsed voltage, although other voltages are also within the scope of the disclosure. In certain embodiments, the bias electrode 340 may be biased using an RF waveform Disposed adjacent to the outer surface 344 of the bias electrode 340 is a magnet 350. The magnet 350 may be constructed of Sm—Co or any suitable material. The magnet 350 may be oriented so that one of its poles (i.e. a first pole) is oriented toward the ion source chamber 320 and the other pole (i.e. the second pole) is oriented toward the chamber wall 321 containing the extraction aperture 330. In certain embodiments, the north pole is oriented toward the ion source chamber 320. Thus, the magnet 350 may be oriented to be parallel to the inner surface 343, such that both poles of magnet 350 are equidistant from the inner surface 343. As best seen in FIG. 3B, the magnet 350 creates a magnetic field 351 that loops around the bias electrode 340. Thus, the bias electrode 340 is encircled by the magnetic field 351. This magnetic field 351 cooperates with the inner surface 343 of the bias electrode 340 to create a confinement region 352. As described before, electrons may be contained in this confinement region 352, which is disposed around the perimeter of the hollow center portion 349, along the inner surface 343. These electrons may collide with neutral particles that diffuse near the extraction aperture 330. These collisions may ionize the neutral particles, increasing the number of ions in this region.

Although not shown, in some embodiments, a coating, similar to that described in connection with FIG. 1A, may be disposed on the inner surface 343 of the bias electrode 340. This coating may be made of graphite or silicon carbide, and may be used to protect the underlying bias electrode 340. However, in other embodiments, this coating may be comprised of a dopant material. For example, in the case where boron ions are to be extracted from the ion source 300, the coating may be pure boron, boron carbide or another boron-based ceramic material. In the case where phosphorus ions are to be extracted from the ion source 300, the coating may be silicon phosphide or another phosphorus-based ceramic material. In operation, energetic particles may strike the coating, causing sputtering. The sputtered material may be neutral particles. However, these neutral particles may collide with the electrons in the confinement region 352 and become ionized, providing additional dopant-containing ions. Thus, by using a coating made of the desired dopant, additional ions of the desired species may be created by the sputtering action.

Furthermore, although not shown, in another embodiment, the bias electrode 340 and the magnet 350 may be disposed outside the ion source chamber 320, similar to the configuration shown in FIG. 2.

In each of these embodiments, a bias electrode having a hollow center portion is disposed near the extraction aperture of an ion source. An inner surface of the bias electrode defines the perimeter of this hollow center portion. A magnetic field is created along this inner surface, where the magnetic field extends in a direction between the first surface of the bias electrode and the second surface. This creates a confinement region that extends around the entirety of the perimeter of the hollow center portion along the inner surface. This confinement region confines energetic electrons, which may collide with neutral particles that diffuse near the extraction aperture. The magnetic field may be created using a single magnet, as shown in FIGS. 3A-3B, or using two magnets, as shown in FIGS. 1A and 2.

The present apparatus has many advantages. First, in certain applications, high current ion beams are preferred. Traditionally, this may be achieved by increasing the power supplied to the RF antenna or filament. However, that approach may negatively impact the lifetime of the ion source. Further, the increased power approach may cause the ion source to be cleaned more often, which decreases its utilization and thus increases cost. In contrast, the present apparatus uses a localized magnetic field disposed near the extraction aperture to create a confinement region where electrons are contained. These electrons collide with neutral particles near the extraction aperture, creating more ions near the extraction aperture. This increases the current of the extracted ion beam. Thus, by utilizing a localized magnetic field, negative effects on the lifetime of the ion source may be avoided. Further, the deposition of material within the ion source may be reduced as well. Thus, the use of this apparatus may improve utilization and therefore increase throughput and reduce cost.

Additionally, by combining a traditional ion source with this localized magnetic field, the disadvantages of using a magnetron can be avoided. Magnetrons typically utilize high gas pressure and higher bias voltages. This leads to more sputtering of the electrode, forcing more cleaning and contamination. However, the combination of a traditional ion source and a localized magnetic field, as described herein, may alleviate these issues.

Further, the operation of the ion source, with respect to supplied power, gas flow rate and other parameters can be regulated independently of the bias electrode and magnet. Thus, each parameter can be individually tuned to a particular application, allowing optimized operation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for creating a high current ion beam, comprising:
    an ion source for generating positive ions, comprising a plurality of chamber walls defining an ion source chamber, wherein a first chamber wall comprises a dielectric window and a second chamber wall, opposite the first chamber wall, includes an extraction aperture, and an antenna disposed proximate the dielectric window outside the ion source chamber, wherein electromagnetic energy created by the antenna creates a plasma within the ion source chamber;
    a bias electrode disposed within the ion source chamber between the first chamber wall and the second chamber wall and proximate the extraction aperture, having an inner surface defining a perimeter of a hollow center portion that is aligned with the extraction aperture; and
    a magnetic field disposed along the perimeter of the hollow center portion, creating a confinement region for electrons proximate the inner surface, wherein electrons are confined within the confinement region and collide with neutral particles to create a high density localized plasma near the extraction aperture, wherein positive ions are created in the ion source chamber between the first wall and the bias electrode, and pass through the hollow center portion and the extraction aperture to exit the ion source chamber.

2. The apparatus of claim 1, wherein the magnetic field is created by a magnet that surrounds an outer surface of the bias electrode, where a first pole of the magnet is oriented toward the ion source chamber and a second pole of the magnet is oriented toward a chamber wall containing the extraction aperture.

3. The apparatus of claim 1, further comprising a first magnet embedded in the bias electrode and oriented with a north pole disposed toward the hollow center portion, and a second magnet embedded in the bias electrode and oriented with a south pole disposed toward the hollow center portion, wherein the magnetic field is created between the north pole of the first magnet and the south pole of the second magnet.

4. The apparatus of claim 3, wherein the south pole of the first magnet and the north pole of the second magnet are each in physical contact with a ferrous material embedded in the bias electrode.

5. The apparatus of claim 3, wherein the first magnet is configured to be parallel to the second magnet.

6. The apparatus of claim 3, wherein the north pole of the first magnet and the south pole of the second magnet are coplanar with the inner surface.

7. The apparatus of claim 1, wherein a coating is disposed on the inner surface of the bias electrode.

8. The apparatus of claim 7, wherein the coating is made of a material comprising a dopant species.

9. An apparatus for creating a high current ion beam, comprising:
    an ion source for generating positive ions, having an ion source chamber and an extraction aperture;
    a bias electrode disposed within the ion source chamber and proximate the extraction aperture, the bias electrode having an inner surface defining a perimeter of a hollow center portion that is aligned with the extraction aperture;

a first magnet embedded in the bias electrode and oriented with a north pole disposed toward the hollow center portion; and a second magnet, parallel to the first magnet, embedded in the bias electrode and oriented with a south pole disposed toward the hollow center portion, wherein a U-shaped magnetic field is created between the north pole of the first magnet and the south pole of the second magnet along a perimeter of the hollow center portion, and wherein a confinement region to contain electrons is created along the inner surface of the bias electrode by the U-shaped magnetic field, wherein positive ions are created in the ion source chamber and pass through the hollow center portion and the extraction aperture to exit the ion source chamber.

10. The apparatus of claim 9, wherein the north pole of the first magnet and the south pole of the second magnet are coplanar with the inner surface.

11. The apparatus of claim 9, further comprising a coating disposed over the inner surface to protect the bias electrode from sputtering.

12. The apparatus of claim 11, wherein the coating is made of a material comprising a dopant species.

13. The apparatus of claim 9, wherein channels are disposed within the bias electrode and further comprising a source of coolant, and a conduit in communication with the source of coolant and the channels within the bias electrode.

14. The apparatus of claim 9, further comprising a ferrous material embedded in the bias electrode, wherein the ferrous material is in physical contact with the south pole of the first magnet and the north pole of the second magnet.

15. An apparatus for creating a high current ion beam, comprising:

an ion source for generating positive ions, comprising a plurality of chamber walls defining an ion source chamber, wherein a first chamber wall comprises a dielectric window and a second chamber wall, opposite the first chamber wall, includes an extraction aperture, and an antenna disposed proximate the dielectric window outside the ion source chamber, wherein electromagnetic energy created by the antenna creates a plasma within the ion source chamber;

a bias electrode disposed within the ion source chamber between the first chamber wall and the second chamber wall and proximate the extraction aperture, the bias electrode having an inner surface defining a perimeter of a hollow center portion that is aligned with the extraction aperture, and an outer surface opposite the inner surface; and a magnet disposed proximate the outer surface of the bias electrode and oriented with a first pole of the magnet disposed toward the first chamber wall of the ion source chamber and a second pole of the magnet disposed toward the second chamber wall containing the extraction aperture;

wherein a magnetic field is created between the first pole of the magnet and the second pole of the magnet that encircles the bias electrode, and wherein a confinement region to contain electrons is created along the inner surface of the bias electrode by the magnetic field, and wherein positive ions are created in the ion source chamber between the first wall and the bias electrode, wherein positive ions are created in the ion source chamber between the first wall and the bias electrode, and pass through the hollow center portion and the extraction aperture to exit the ion source chamber.

16. The apparatus of claim 15, wherein the magnet is parallel to the inner surface of the bias electrode.

17. The apparatus of claim 15, wherein a coating is disposed on the inner surface of the bias electrode.

18. The apparatus of claim 17, wherein the coating is made of a material comprising a dopant species.

* * * * *